United States Patent
Yang et al.

(10) Patent No.: US 10,718,802 B2
(45) Date of Patent: Jul. 21, 2020

(54) MEMS-BASED ATMOSPHERIC ELECTRIC FIELD SENSOR ON THE GROUND

(71) Applicant: Beijing Tflying Transducer Technology Co., Ltd., Beijing (CN)

(72) Inventors: Pengfei Yang, Beijing (CN); Chunrong Peng, Beijing (CN); Shanhong Xia, Beijing (CN); Yutao Liu, Beijing (CN); Shuang Wu, Beijing (CN)

(73) Assignee: Beijing Tflying Transducer Technology Co., Ltd., Beijing (CN)

( * ) Notice: Subject to any disclaimer, the term of this patent is extended or adjusted under 35 U.S.C. 154(b) by 286 days.

(21) Appl. No.: 15/992,214

(22) Filed: May 30, 2018

(65) Prior Publication Data
US 2019/0094283 A1 Mar. 28, 2019

(30) Foreign Application Priority Data
May 31, 2017 (CN) .......................... 2017 1 0401997

(51) Int. Cl.
*G01R 29/12* (2006.01)
*G01W 1/16* (2006.01)

(52) U.S. Cl.
CPC ............... *G01R 29/12* (2013.01); *G01W 1/16* (2013.01)

(58) Field of Classification Search
CPC .................................. G01R 29/12; G01W 1/16
See application file for complete search history.

(56) References Cited

U.S. PATENT DOCUMENTS 3,916,305 A * 10/1975 Few, Jr. ................. G01R 19/08
324/72
3,919,636 A * 11/1975 Few ....................... G01R 29/12
324/72

(Continued)

FOREIGN PATENT DOCUMENTS

CN         103983863 A      8/2014
CN         105954602 A      9/2016
(Continued)

OTHER PUBLICATIONS

Yang Pengfei; Chen Bo; Wen Xiaolong; Peng Chunrong;Xia Shanhong; Hao Yilong; <A Novel MEMS Chip-based Ground Atmospheric Electric Field Sensor> from <Journal of Electronics & Information Technology> vol. 38, No. 6; Jun. 30, 2016.

*Primary Examiner* — Walter L Lindsay, Jr.
*Assistant Examiner* — Milton Gonzalez
(74) *Attorney, Agent, or Firm* — Gang Yu

(57) ABSTRACT

A MEMS-based atmospheric electric field sensor on the ground includes an arc-roof detection structure and a MEMS electric field measuring module. The arc-roof detection structure includes an electric conducting arc-roof rainproof housing, an electric conducting connecting column, a fixing-supporting chamber body upper part, and a fixing-supporting chamber body lower part. The top part of the electric conducting arc-roof rainproof housing is arc-shaped, and the bottom part of the same is provided with a groove facing towards the top part. The electric conducting connecting column is arranged on a top part of the groove and electrically connected to the arc-roof rainproof housing. The fixing-supporting chamber body upper part is a barrel in the groove. The fixing-supporting chamber body closes the bottom opening of the fixing-supporting chamber body upper part to form a fixing-supporting chamber body. The (Continued)

MEMS electric field measuring module is provided inside the fixing-supporting chamber body.

20 Claims, 5 Drawing Sheets

(56) References Cited

U.S. PATENT DOCUMENTS

| | | | |
|---|---|---|---|
| 3,925,726 A | | 12/1975 | Few |
| 4,424,481 A | * | 1/1984 | Laroche ................ G01R 29/12 324/457 |
| 2010/0156429 A1 | | 6/2010 | Peirce |
| 2016/0091546 A1 | | 3/2016 | Xia et al. |

FOREIGN PATENT DOCUMENTS

| | | |
|---|---|---|
| CN | 106124870 A | 11/2016 |
| CN | 206038938 U | 3/2017 |
| CN | 106707038 A | 5/2017 |
| CN | 107300642 A | 10/2017 |
| CN | 206906494 U | 1/2018 |

* cited by examiner

MEMS-BASED ATMOSPHERIC ELECTRIC FIELD SENSOR ON THE GROUND

TECHNICAL FIELD

The present disclosure relates to the field of sensor technology, particularly to a MEMS (Micro-Electro-Mechanical System)-based atmospheric electric field sensor on the ground.

BACKGROUND

The lightning disaster is one of the ten major natural disasters announced by the United Nations. According to incomplete statistics, the number of casualties caused by lightning strikes in China amounts to more than one thousand a year, resulting in huge losses of property. Lightning is also an important weather factor that directly affects the success or failure of a space launch. In the specification of spacecraft launch, strength of the atmospheric electric field has been listed as one of the main conditions that determines whether a spacecraft can be launched or not. Lightning strike would cause serious damages to the power grid, such as line tripping, power transmission and transformation equipment fault, unplanned line outage, etc. These damages directly influence the safe and stable operation of the power grid and the safety and reliability of power supply and power usage. In the petrochemical industry, besides a large amount of lightning-sensitive electrical and electronic equipment and ancillary facilities, most of the storage and transportation of materials and finished products in the production process are flammable and explosive. Thus, the petrochemical industry is one of the sensitive industries where lightning disasters and accidents occur frequently. It is of great significance in lightning protection and disaster reduction and developmental trend of disastrous weather forecast such as lighting etc. for meteorological departments in the future to monitor and analyze the changes of atmospheric electric field intensity and polarities etc., by using electrostatic field sensors, identify the changes of atmospheric electric field that may cause lightning strikes, and make early warnings before the disasters. However, at home and abroad, a majority of commercial electrostatic field sensors adopt the traditional mechanical processing technology and have the mechanical components that are prone to wear. Moreover, some problems also exist in the aspects of size, power consumption and other performances, so these electrostatic field sensors cannot be widely used.

SUMMARY OF THE DISCLOSURE

In view of the foregoing technical problems, in order to overcome the above-mentioned drawbacks in the prior art, a MEMS-based atmospheric electric field sensor on the ground is provided by the present disclosure.

According to an aspect of the present disclosure, a MEMS-based atmospheric electric field sensor on the ground is provided, which comprises an arc-roof detection structure including: an electric conducting arc-roof rainproof housing, wherein a top part of the electric conducting arc-roof rainproof housing is arc-shaped, a bottom part of the electric conducting arc-roof rainproof housing is provided with a groove facing towards the top part; an electric conducting connecting column provided at a top part of the groove and electrically connected to the arc-roof rainproof housing; a fixing-supporting chamber body upper part which is a barrel with a closed top part and an open bottom part and is provided in the groove; the connecting column runs through a top part of the fixing-supporting chamber body upper part and is electrically insulated from the fixing-supporting chamber body upper part; to form a fixing-supporting chamber body, a fixing-supporting chamber body lower part is used to close a bottom opening of the fixing-supporting chamber body upper part; and a MEMS electric field measuring module is provided inside the fixing-supporting chamber body for detecting an external electric field through the electric conducting connecting column and the electric conducting arc-roof rainproof housing.

According to a MEMS-based atmospheric electric field sensor on the ground of an embodiment of the present disclosure, the MEMS-based atmospheric electric field sensor on the ground further comprises a chamber body structure provided under the arc-roof detection structure. The chamber body structure comprises a main housing which is a barrel with a closed top part and an open bottom part, and the top part is provided with a first hole; and a back cover, the back cover is used for closing a bottom opening of the main housing, and the MEMS electric field measuring module is provided inside the chamber body structure.

According to a MEMS-based atmospheric electric field sensor on the ground of an embodiment of the present disclosure, the MEMS electric field measuring module comprises a MEMS electric field sensitive chip for detecting the external electric field to generate an induced current; a pre-amplification circuit for converting a current signal into a voltage signal; a driving demodulation circuit for providing a working signal to the MEMS electric field sensitive chip and performing a electric field information calculation based on the voltage signal; and a top part of a package of the MEMS electric field sensitive chip is a metal cover plate.

According to a MEMS-based atmospheric electric field sensor on the ground of an embodiment of the present disclosure, the metal cover plate is electrically connected to the electric conducting connecting column through a conducting wire.

According to a MEMS-based atmospheric electric field sensor on the ground of an embodiment of the present disclosure, the fixing-supporting chamber body lower part is provided with a second hole, the first hole and the second hole are used for the conducting wire to pass through.

According to a MEMS-based atmospheric electric field sensor on the ground of an embodiment of the present disclosure, the MEMS electric field measuring module further comprises an insulating seal box for accommodating the MEMS electric field sensitive chip and pre-amplification circuit successively arranged in stack-up manner; and a metal sensing board provided at an outer side of a box wall of the insulating seal box close to the metal cover plate of the MEMS electric field sensitive chip.

According to a MEMS-based atmospheric electric field sensor on the ground of an embodiment of the present disclosure, the metal sensing board is electrically connected to the electric conducting connecting column through a conducting wire.

According to a MEMS-based atmospheric electric field sensor on the ground of an embodiment of the present disclosure, the insulating seal box is configured to accommodate the MEMS electric field sensitive chip, the pre-amplification circuit, and the driving demodulation circuit which are successively arranged in a stack-up manner.

According to a MEMS-based atmospheric electric field sensor on the ground of an embodiment of the present disclosure, at least one of the main housing and the back cover comprises a sealing groove and/or a glue-filling groove for hermetically connecting the main housing and the back cover.

According to a MEMS-based atmospheric electric field sensor on the ground of an embodiment of the present disclosure, the insulating seal box is internally provided with a desiccant.

According to a MEMS-based atmospheric electric field sensor on the ground of an embodiment of the present disclosure, the fixing-supporting chamber body upper part and the fixing-supporting chamber body lower part are made of a metal material or an insulating material electroplated with a metal layer on the surface.

According to a MEMS-based atmospheric electric field sensor on the ground of an embodiment of the present disclosure, the main housing and the back cover are made of a metal material or an insulating material electroplated with a metal layer on the surface.

According to a MEMS-based atmospheric electric field sensor on the ground of an embodiment of the present disclosure, the chamber body structure is internally provided with a fixing device for fixing the MEMS electric field measuring module.

Based on the foregoing technical solutions, the present disclosure has the following advantages.

With the use of the MEMS electric field sensitive chip technology with low power consumption, there are no mechanical components having motors that are prone to be worn, so the power consumption is reduced, the mass production is easy, and the reliability of products is improved.

With the use of the arc-roof rainproof housing, both the top part and circumference of the arc-roof rainproof housing can induce the electric field, so the induction area of electric field is increased and the sensitivity of the sensor is improved.

With the use of the metal chamber wall structure, the anti-static and anti-electromagnetic interference performances of the sensor are improved, and the influence to the electric field measurement due to the dust in the air is reduced.

With the design of sealed structure, the influence to the MEMS electric field sensitive chip package due to the ambient humidity can be avoided, and the accuracy and long-term stability of the electric field detection can be improved.

DETAILED DESCRIPTION OF THE DISCLOSURE

Some embodiments of the present disclosure will be described comprehensively hereinafter with reference to the drawings. The embodiments, however, are shown partially rather than completely. Actually, the various embodiments of the present disclosure may be implement in many different forms rather than be limited to the embodiments described herein. Correspondingly, these embodiments are provided so that the present disclosure complies with the requirements of current law.

To make the objectives, technical solutions and advantages of the present disclosure clearer, the present disclosure will be described in detail below with reference to the specific embodiments and the drawings.

Figure 1:
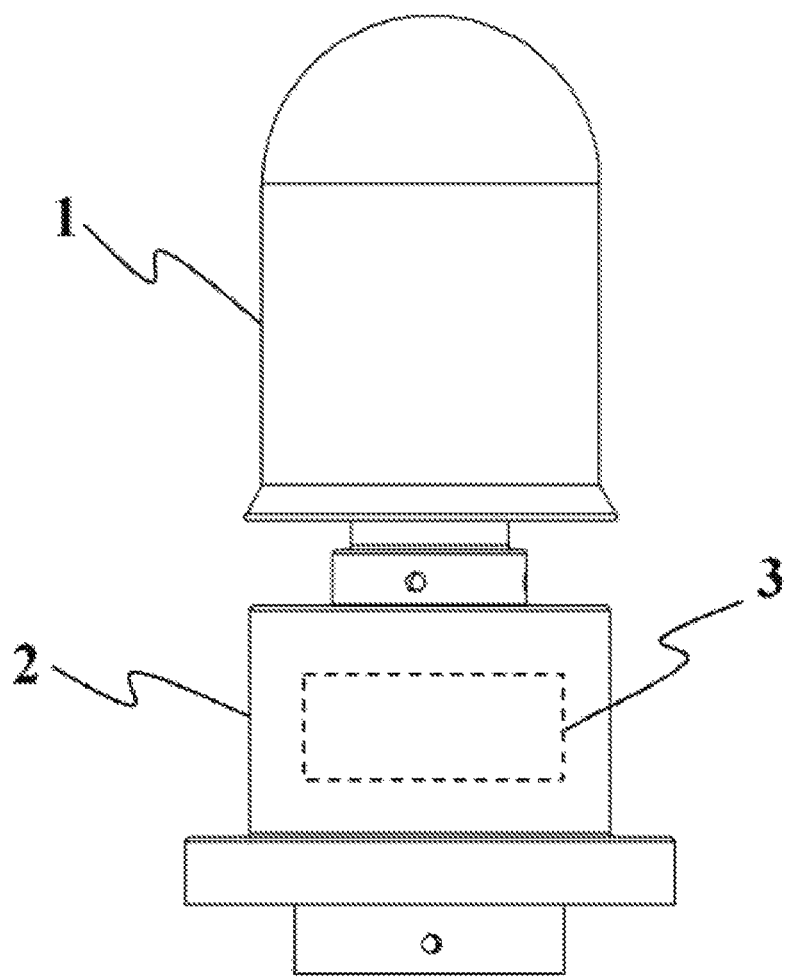
FIG. 1 is a structural schematic diagram of a MEMS-based atmospheric electric field sensor on the ground according to an embodiment of the present disclosure.
Figure 2:
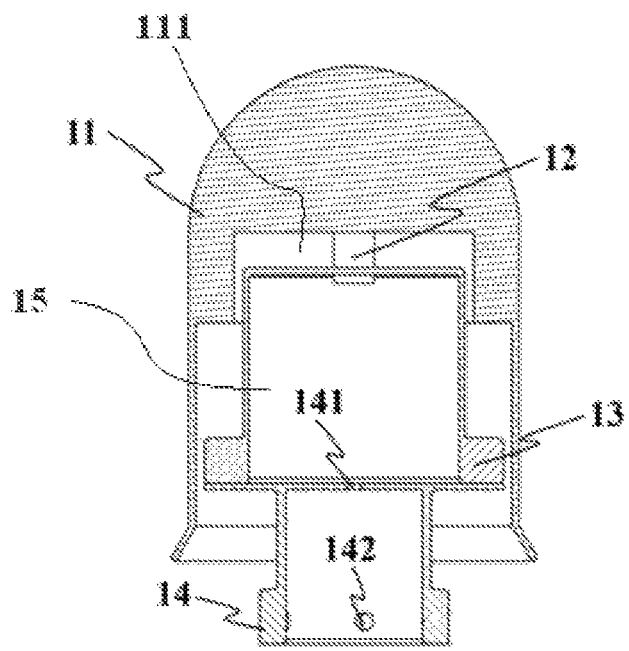
FIG. 2 is a cross-sectional schematic diagram of the arc-roof detection structure shown in FIG. 1.

According to an embodiment of the present disclosure, a MEMS-based atmospheric electric field sensor on the ground is provided, which may have a metal seal structure. FIG. 1 is a structural schematic diagram of a MEMS-based atmospheric electric field sensor on the ground according to an embodiment of the present disclosure. As shown in FIG. 1, the MEMS-based atmospheric electric field sensor on the ground comprises an arc-roof detection structure 1 and a MEMS electric field measuring module 3. FIG. 2 is a cross-sectional schematic diagram of the arc-roof detection structure shown in FIG. 1. As shown in FIG. 2, the shape of the arc-roof detection structure 1 may be a cylinder, an elliptic cylinder, a cuboid, a cube, or other regular or irregular polyhedron etc. The arc-roof detection structure 1 comprises an electric conducting arc-roof rainproof housing 11, an electric conducting connecting column 12, a fixing-supporting chamber body upper part 13 and a fixing-supporting chamber body lower part 14. The top part of the electric conducting arc-roof rainproof housing 11 is arc-shaped, the bottom part of the electric conducting arc-roof rainproof housing 11 is provided with a groove 111 facing towards the top part. The electric conducting connecting column 12 is provided at the top part of the groove 111 and is electrically connected to the arc-roof rainproof housing 11. The fixing-supporting chamber body upper part 13 is a barrel with a closed top part and an open bottom part and provided in the groove 111. The connecting column 12 runs through a top part of the fixing-supporting chamber body upper part 13 and is electrically insulated from the fixing-supporting chamber body upper part 13. The fixing-supporting chamber body lower part 14 closes the bottom opening of the fixing-supporting chamber body upper part 13 to form a fixing-supporting chamber body 15. The MEMS electric field measuring module can be configured inside the fixing-supporting chamber body 15 for detecting the external electric field through the electric conducting connecting column 12 and the electric conducting arc-roof rainproof housing 11. The electric conducting arc-roof rainproof housing 11, the electric conducting connecting column 12, the arc-roof fixing-supporting chamber body upper part 13, and the arc-roof fixing-supporting chamber body lower part 14 are all electrical conductive and may be made of a metal material or an insulating material electroplated with metal on the inner surface, outer surface, or the inner and outer surfaces. The electric conducting arc-roof rainproof housing 11 which is electrically connected to the electric conducting connecting column 12 is an isolated conductor. The electric conducting connecting column 12 and the fixing-supporting chamber body upper part 13 are electrically isolated through an insulation and isolation structure. The material of the insulation and isolation structure can be an inorganic insulating material, an organic insulating material, or a mixed insulating material. The connecting column 12 and the fixing-supporting chamber body upper part 13, the fixing-supporting chamber body upper part 13 and the fixing-supporting chamber body lower part 14 can be fixed together by screws or other fixing methods such as welding, bonding, etc.

Figure 3:
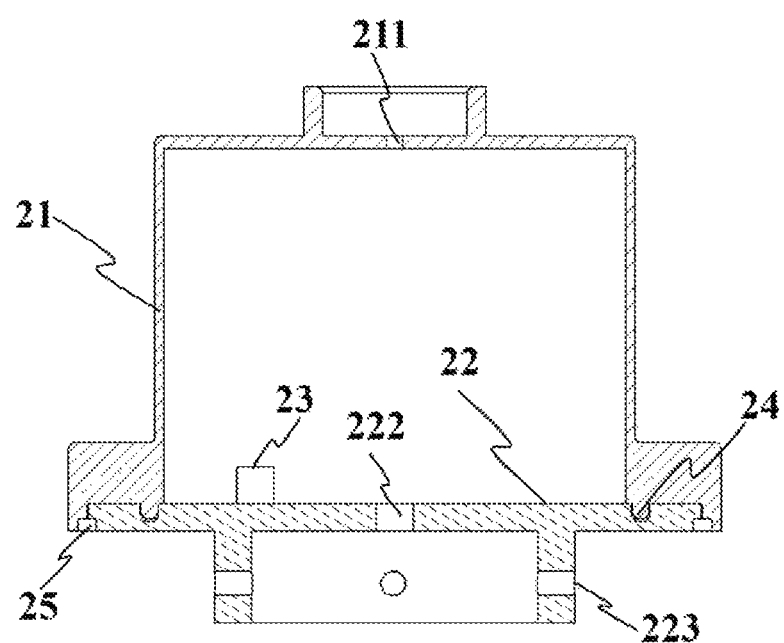
FIG. 3 is a cross-sectional schematic diagram of the chamber body structure shown in FIG. 1.

In another embodiment, as shown in FIG. 1, the MEMS-based atmospheric electric field sensor on the ground may further comprises a chamber body structure 2. The MEMS electric field measuring module 3 is provided inside the chamber body structure 2, and detects the external electric field through the electric conducting connecting column 12 and electric conducting arc-roof rainproof housing 11. FIG. 3 is a cross-sectional schematic diagram of the chamber body structure shown in FIG. 1. As shown in FIG. 3, the chamber body structure 2 mainly comprises a main housing 21 and a back cover 22. The shape of the chamber body structure 2 may be a cylinder, an elliptic cylinder, a cuboid, a cubic or other regular or irregular polyhedrons. The main housing 21 is a barrel with a closed top part and an open bottom part. The top part of the main housing is provided with a first hole 211. The first hole 211 may be located at the center position or non-center position of the top part for introducing the conducting wire that electrically connected to the electric conducting connecting column into the chamber body structure 2. At the same time, the bottom opening of the fixing-supporting chamber body upper part 13 is closed, and the top part of the fixing-supporting chamber body lower part 14 is also provided with a second hole 141 in the center position or non-center position. The conducting wire electrically connected to the electric conducting connecting column successively passes through the second hole 141 and the first hole 211. The back cover is used to close the bottom opening of the main housing 21. The chamber body structure 2 may be provided with sealing groove 24 and/or the glue-filling groove 25 which are respectively used to accommodate seal ring and fill seal glue. The sealing groove 24 and/or the glue-filling groove 25 may be disposed on at least one of the main housing 21 and the back cover 22, so that the main housing 21 and the back cover 22 are hermetically connected. Certainly, the sealing groove 24 or the glue-filling groove 25 may not be provided, and the glue is directly applied on the contact part of the main housing 21 and the back cover 22 of the seal chamber body for seal or the sealant is canned into the interior of the chamber body structure 2. The material of the seal ring may be fluoro rubber, silicone rubber, nitrile rubber etc. The sealant may be glass cement, silicone rubber, AB glue, epoxy glue etc. The main housing 21 and the back cover 22 of the seal chamber body may also be fixed by screws. In addition, the arc-roof detection structure 1 and the chamber body structure 2 are fixed by screws. In this case, the fixing-supporting chamber body lower part 14 may be configured with a screw passing hole 142. The arc-roof detection structure 1 and the chamber body structure 2 may also be fixed by other methods such as welding, bonding, etc.

The chamber body structure 2 may also be internally provided with a fixing column 23 for fixing and supporting the MEMS electric field measuring module 3 located in the chamber body structure 2. According to one embodiment, the fixing column 23 is fixedly connected to the back cover 22. The main housing 21, the back cover 22 and the fixing column 23 of the chamber body are all electrical conductive, and may be made of a metal material or an insulating material electroplated with metal on the inner surface or the outer surface or the inner and outer surfaces.

Figure 4:
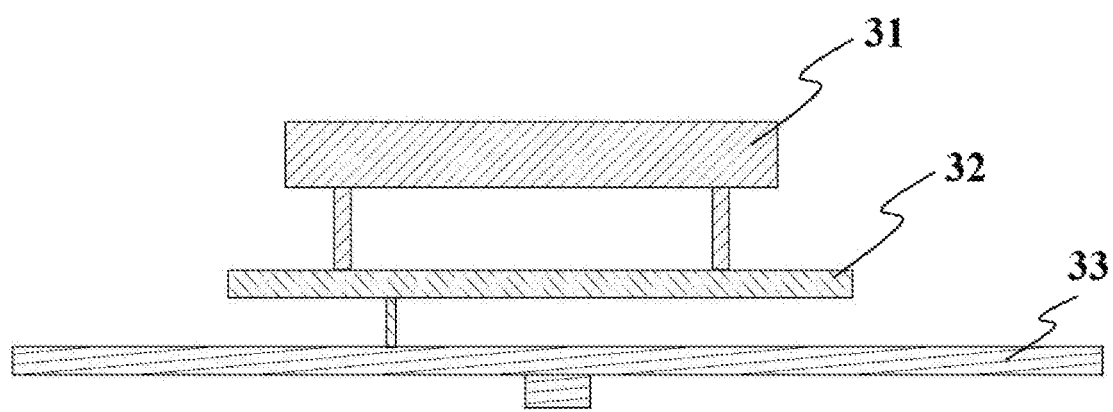
FIG. 4 is a structural schematic diagram of a MEMS electric field measuring module according to an embodiment of the present disclosure.

FIG. 4 is a structural schematic diagram of a MEMS electric field measuring module according to an embodiment of the present disclosure. As shown in FIG. 4, the MEMS electric field measuring module 3 provided in the fixing-supporting chamber body 15 or the chamber body structure 2 mainly comprises a MEMS electric field sensitive chip 31, a pre-amplification circuit 32 and a driving demodulation circuit 33. The shape of the MEMS electric field measuring module 3 may be round, oval, rectangular, square or polygonal, etc. One or more MEMS electric field measuring module 3 may be mounted inside the fixing-supporting chamber body 15 or the chamber body structure 2. The shielding electrode of the MEMS electric field sensitive chip 31 periodically vibrates and modulates the induction electrode to generate induced current. The package base-seat of the MEMS electric field sensitive chip 31 is made of an insulating material and the top part of the MEMS electric field sensitive chip 31 is a metal cover plate. The pre-amplification circuit 32 is configured to realize the conversion from current signal into voltage signal of the electric field. The driving demodulation circuit 33 generates two-way differential signals required by the normal operation of the MEMS electric field sensitive chip 31 and realizes the electric field information calculation based on the voltage signal output by the pre-amplification circuit 32. In an embodiment, the MEMS electric field sensitive chip 31, the pre-amplification circuit 32 and the driving demodulation circuit 33 are arranged in a stack-up manner and fixed at the fixing column 23 of the chamber body structure 2, and in other embodiments, they may be arranged horizontally or vertically in a side by side manner, etc. The metal cover plate at the top of the package of the MEMS electric field sensitive chip 31 is electrically connected to the electric conducting connecting column 12 of the arc-roof detection structure 1 through conducting wires, so as to achieve the electrical connection with the arc-roof rainproof housing 11. The conducting wire may be a common conducting wire, a shielding wire, a high-frequency radio-frequency line, a semi-rigid semi-flexible radio-frequency cable etc. With the use of the MEMS electric field measuring module, the operating principle of the MEMS-based atmospheric electric field sensor on the ground is as follows: since the arc-roof rainproof housing 11 of the sensor is electrically connected to the metal cover plate of the MEMS electric field sensitive chip 31, when a direct current (dc) electric field E exists in the exterior, the arc-roof rainproof housing 11 and the metal cover plate of the sensor produce induced charges and the production of induced charges is linearly correlated to the dc electric field E. The induced charges of the metal cover plate form an electric field Eg, and Eg is linearly correlated to the direct current electric field E. The MEMS electric field sensitive chip 31 indirectly measures the magnitude of the external direct current electric field by measuring the electric field Eg.

As shown in FIG. 3, when the MEMS electric field measuring module 3 is disposed in the chamber body structure 2, the power supply cable and the signal transmission cable are leaded out through a third hole 222 configured at the back cover 22 of the seal chamber body structure, and the third hole 222 may be a central hole or a non-central hole. When the MEMS electric field measuring module 3 with the foregoing structure is adopted, the chamber body structure 2 for accommodating the MEMS electric field measuring module 3 is sealed by the above-mentioned seal ring or sealant, and the cables pass through the third hole 222 of the back cover 22, a spin-coat of sealant should be performed to achieve the sealing of the chamber body. After the conducting wire electrically connected to the electric conducting connecting column 12 passes through the first hole 211 at the top of the main housing 21 of the seal chamber body and the second hole 141 at the fixing supporting chamber lower part 14, a spin-coat of sealant needs to be performed to achieve the overall sealing of the chamber body structure 2.

In an embodiment, when the above-mentioned MEMS electric field measuring module 3 is arranged in the fixing-supporting chamber body, the fixing supporting chamber body formed by the fixing-supporting chamber body upper part 13 and the fixing-supporting chamber body lower part 14 also needs to be configured hermetically, the contact position of the fixing-supporting chamber body upper part 13 and the fixing-supporting chamber body lower part 14 may be spin-coated with sealant, or a sealant is directly canned into the fixing-supporting chamber body. The sealant may be the glass cement, silicone rubber, AB glue, epoxy glue etc. Since the electric conducting connecting column 12 is located close to the metal cover plate of the MEMS electric field sensitive chip 31, charges can be induced on the metal cover plate corresponding to the electric conducting connecting column 12. The electric conducting connecting column 12 may or may not electrically connected to the metal cover plate of the MEMS electric field sensitive chip 31.

Figure 5:
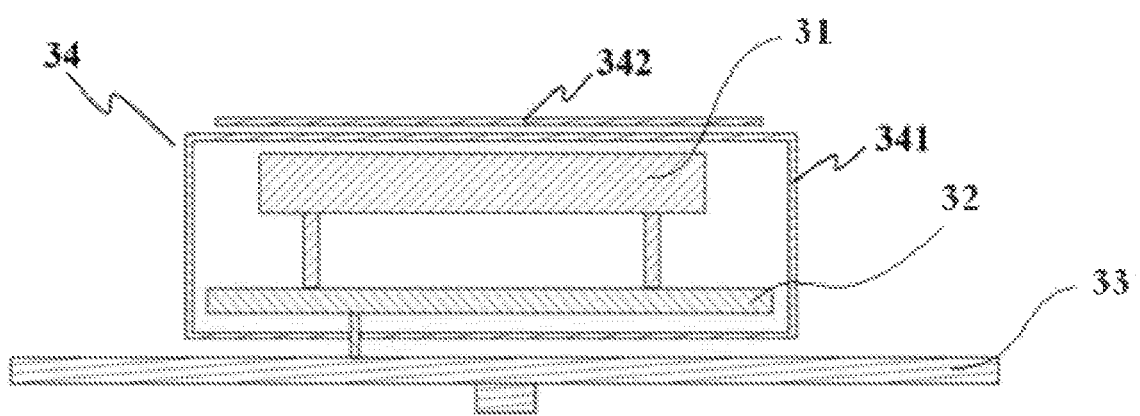
FIG. 5 is a structural schematic diagram of a MEMS electric field measuring module according to another embodiment of the present disclosure.

FIG. 5 is a structural schematic diagram of a MEMS electric field measuring module according to another embodiment of the present disclosure. Specifically, as shown in FIG. 5, compared with the embodiment shown in FIG. 4, the MEMS electric field measuring module 3 further comprises an insulating seal box 34. The MEMS electric field sensitive chip 31 and the pre-amplification circuit 32 which are arranged in stack-up manner are put into the insulating seal box 34 first. The top part of the seal box body 341 is provided with a metal sensing board 342. The metal sensing board 342 is fixedly connected to the seal box body 341. The shape of the insulating seal box 34 may be a cylinder, an elliptic cylinder, a cuboid, a cube or other regular or irregular polyhedrons. The seal box body 341 may be made of inorganic insulating materials, organic insulating materials or mixed insulating materials. The insulating seal box 34 and the driving demodulation circuit 33 are arranged in a stack-up -manner. After the signal connecting wire of the driving demodulation circuit 33 and the pre-amplification circuit 32 passes out of the signal output interface of the insulating seal box 34, the signal output interface is spin-coated with sealant, so as to realize the sealing. The driving demodulation circuit 33 can also be arranged inside the insulating seal box 34 together with the electric field sensitive chip 31 and the pre-amplification circuit 32. Different from the solution where the metal cover plate of the MEMS electric field sensitive chip 31 is electrically connected to the arc-roof rainproof housing 11 shown in FIG. 4, in this solution, merely the metal sensing board 342 needs to be electrically connected to the arc-roof rainproof housing 11 through conducting wire. The conducting wire may be a common conducting wire, a shielding conducting wire, a high-frequency radio-frequency cable, a semi-rigid semi-flexible radio-frequency cable, etc.

With the use of the MEMS electric field measuring module, the operating principle of the MEMS-based atmospheric electric field sensor on the ground is as follows: Since the arc-roof rainproof housing 11 of the sensor is electrically connected to the metal sensing board 342 above the seal box body 341 while a capacitor structure is formed between the metal sensing board 342 and the metal cover plate of the MEMS electric field sensitive chip, when a dc electric field E exists in the exterior, induced charges will be produced in the metal cover plate. These induced charges generate an electric field Ed, and the electric field Ed is linearly correlated to the direct current electric field E, so that the MEMS electric field sensitive chip 31 can indirectly measure the magnitude of the external dc electric field E by measuring the electric field Ed.

When the MEMS electric field measuring module 3 with such structure is used, the fixing-supporting chamber body or the chamber body structure 2 for accommodating the MEMS electric field measuring module 3 may not be sealed.

According to a MEMS-based atmospheric electric field sensor on the ground of an embodiment, the desiccant or other kind of hygroscopic material may be placed inside the sealed chamber body structure 2, the insulating seal box 34, or the sealed fixing-supporting chamber body to ensure the dryness in the sealed environment, so as to prevent the components of the MEMS electric field measuring module from being corroded, thereby ensuring its working performances.

In an embodiment, the MEMS-based atmospheric electric field sensor on the ground may also be fixed on a metal bracket to measure the atmospheric electric field. For instance, the MEMS-based atmospheric electric field sensor on the ground may be mounted on the metal bracket through mounting holes 223 at the bottom of the chamber body structure 2, the metal bracket is electrically connected to the chamber body structure 2, and the metal bracket may be grounded to prevent the chamber body structure 2 from gathering too much charges. The metal bracket may not be grounded, and the bracket may also be made of other materials, such as wood, plastic, etc. In other embodiments, the bracket may not be used, the MEMS-based atmospheric electric field sensor on the ground is directly mounted on some devices or placed on the ground to perform the electric field measurement.

Besides measuring the atmospheric electric field, the MEMS-based atmospheric electric field sensor on the ground according to the embodiments of the present disclosure may also be applied in lightning pre-warning, industrial electrostatic measurement, dc electric field measurement of power grid and related electrostatic field measurement devices.

It should be noted that the shapes and dimensions of the respective components in the drawings do not reflect the true sizes and proportions of the sample and are merely intended to illustrate the contents of the embodiments of the present disclosure.

Directional terms such as "up", "down", "front", "back", "left", "right" etc. mentioned in the embodiments merely refer to the directions with reference to the drawings and are not intended to limit the protection scope of the present disclosure. Base on the considerations about design and reliability, the foregoing embodiments may be used in mixed combination with each other or be used in mixed combination with other embodiments, i.e. the technical features in different embodiments may be freely combined to form more embodiments.

It should be noted that the implementations that are not shown or described in the drawings or the specification are all known to those of ordinary skill in the art so they are not described in detail. Besides, the definitions of the foregoing elements and methods are not limited to the specific structures, shapes or manners mentioned in the embodiments, and may be simply modified or substituted by those skilled in the art.

The objectives, technical solutions and advantages of the present disclosure are further described in detail in the foregoing embodiments. It should be understood that the above descriptions are merely the specific embodiments of the present disclosure and are not intended to limit the present disclosure. Any modification, equivalent replacement, improvement etc. derived within the spirit and principle of the present disclosure also fall within the protection scope of the present disclosure.

The invention claimed is:

1. A MEMS-based atmospheric electric field sensor on the ground, comprising:
   an arc-roof detection structure (1), the arc-roof detection structure (1) comprises:
      an electric conducting arc-roof rainproof housing (11), wherein a top part of the electric conducting arc-roof rainproof housing is arc-shaped, and a bottom part of the electric conducting arc-roof rainproof housing is provided with a groove (111) facing towards the top part;
      an electric conducting connecting column (12) provided at a top part of the groove (111) and electrically connected to the arc-roof rainproof housing (11);
      a fixing-supporting chamber body upper part (13) which is a barrel with a closed top part and an open bottom part, and is provided in the groove (111); wherein, the electric conducting connecting column (12) runs through a top part of the fixing-supporting chamber body upper part (13) and is electrically insulated from the fixing-supporting chamber body upper part (13); and
      a fixing-supporting chamber body lower part (14) for closing a bottom opening of the fixing-supporting chamber body upper part (13) to form a fixing-supporting chamber body (15); and
   a MEMS electric field measuring module (3) provided inside the fixing-supporting chamber body (15) for detecting an external electric field through the electric conducting connecting column (12) and the electric conducting arc-roof rainproof housing (11).

2. The MEMS-based atmospheric electric field sensor on the ground of claim 1, wherein the MEMS-based atmospheric electric field sensor on the ground further comprises:
   a chamber body structure (2) provided under the arc-roof detection structure (1),
   wherein the chamber body structure comprises:
   a main housing (21) which is a barrel with a closed top part and an open bottom part, wherein the top part of the main housing is provided with a first hole (211); and
   a back cover (22) for closing a bottom opening of the main housing (21),
   wherein the MEMS electric field measuring module (3) is provided inside the chamber body structure (2).

3. The MEMS-based atmospheric electric field sensor on the ground of claim 2, wherein
   at least one of the main housing (21) and the back cover (22) comprises a sealing groove (24) and/or a glue-filling groove (25) for hermetically connecting the main housing (21) and the back cover (22).

4. The MEMS-based atmospheric electric field sensor on the ground of claim 2, wherein
   the main housing (21) and the back cover (22) are made of a metal material or an insulating material electroplated with a metal layer on a surface.

5. The MEMS-based atmospheric electric field sensor on the ground of claim 2, wherein
   the chamber body structure (2) is internally provided with a fixing device for fixing the MEMS electric field measuring module (3).

6. The MEMS-based atmospheric electric field sensor on the ground of claim 1, wherein the MEMS electric field measuring module (3) comprises:
   a MEMS electric field sensitive chip (31) for detecting an external electric field to generate an induced current;
   a pre-amplification circuit (32) for converting a current signal into a voltage signal; and
   a driving demodulation circuit (33) for providing a working signal to the MEMS electric field sensitive chip (31), and performing an electric field information calculation based on the voltage signal; wherein
   a top part of a package of the MEMS electric field sensitive chip (31) is a metal cover plate.

7. The MEMS-based atmospheric electric field sensor on the ground of claim 6, wherein
   the metal cover plate is electrically connected to the electric conducting connecting column (12) through a conducting wire.

8. The MEMS-based atmospheric electric field sensor on the ground of claim 7, wherein
   the fixing-supporting chamber body lower part (14) is provided with a second hole (141), the first hole (211) and the second hole (141) are used for the conducting wire to pass through.

9. The MEMS-based atmospheric electric field sensor on the ground of claim 6, wherein
   the MEMS electric field measuring module (3) further comprises:
   an insulating seal box (34) for accommodating the MEMS electric field sensitive chip (31) and the pre-amplification circuit (32), wherein the MEMS electric field sensitive chip (31) and the pre-amplification circuit (32) are successively arranged in a stack-up manner; and
   a metal sensing board (342) provided at an outer side of a box wall of the insulating seal box (34) closing to the metal cover plate of the MEMS electric field sensitive chip (31).

10. The MEMS-based atmospheric electric field sensor on the ground of claim 9, wherein
    the metal sensing board (342) is electrically connected to the electric conducting connecting column (12) through a conducting wire.

11. The MEMS-based atmospheric electric field sensor on the ground of claim 9, wherein
    the insulating seal box is configured to accommodate the MEMS electric field sensitive chip (31), the pre-amplification circuit (32), and the driving demodulation circuit (33), wherein the MEMS electric field sensitive chip (31), the pre-amplification circuit (32), and the driving demodulation circuit (33) are successively arranged in the stack-up manner.

12. The MEMS-based atmospheric electric field sensor on the ground of claim 9, wherein
    the insulating seal box (34) is internally provided with a desiccant.

13. The MEMS-based atmospheric electric field sensor on the ground of claim 1, wherein
    the fixing-supporting chamber body upper part (13) and the fixing-supporting chamber body lower part (14) are made of a metal material or an insulating material electroplated with a metal layer on a surface.

14. A MEMS-based atmospheric electric field sensor, on the ground, comprising:
    an arc-roof detection structure (1), the arc-roof detection structure (1) comprises:

an electric conducting arc-roof rainproof housing (11), wherein a top part of the electric conducting arc-roof rainproof housing is arc-shaped, and a bottom part of the electric conducting arc-roof rainproof housing is provided with a groove facing towards the top part;

an electric conducting connecting column (12) provided at a top part of the groove and electrically connected to the arc-roof rainproof housing (11);

a fixing-supporting chamber body upper part (13) which is a barrel with a closed top part and an open bottom part, and is provided in the groove; wherein, the electric conducting connecting column (12) runs through a top part of the fixing-supporting chamber body upper part (13) and is electrically insulated from the fixing-supporting chamber body upper part (13); and a fixing-supporting chamber body lower part (14) for closing a bottom opening of the fixing-supporting chamber body upper part (13) to form a fixing-supporting chamber body;

a chamber body structure (2) provided under the arc-roof detection structure (1), wherein the chamber body structure comprises:

a main housing (21) which is a barrel with a closed top part and an open bottom part, wherein the top part of the main housing is provided with a first hole (211); and a back cover (22) for closing a bottom opening of the main housing (21), and a MEMS electric field measuring module (3) provided inside the chamber body structure (2) for detecting an external electric field through the electric conducting connecting column (12) and the electric conducting arc-roof rainproof housing (11).

15. The MEMS-based atmospheric electric field sensor on the ground of claim 14, wherein the MEMS electric field measuring module (3) comprises:

a MEMS electric field sensitive chip (31) for detecting an external electric field to generate an induced current;

a pre-amplification circuit (32) for converting a current signal into a voltage signal; and a driving demodulation circuit (33) for providing a working signal to the MEMS electric field sensitive chip (31), and performing an electric field information calculation based on the voltage signal; wherein a top part of a package of the MEMS electric field sensitive chip (31) is a metal cover plate.

16. The MEMS-based atmospheric electric field sensor on the ground of claim 15, wherein the metal cover plate is electrically connected to the electric conducting connecting column (12) through a conducting wire.

17. The MEMS-based atmospheric electric field sensor on the ground of claim 16, wherein the fixing-supporting chamber body lower part (14) is provided with a second hole (141), the first hole (211) and the second hole (141) are used for the conducting wire to pass through.

18. The MEMS-based atmospheric electric field sensor on the ground of claim 15, wherein the MEMS electric field measuring module (3) further comprises:

an insulating seal box (34) for accommodating the MEMS electric field sensitive chip (31) and the pre-amplification circuit (32), wherein the MEMS electric field sensitive chip (31) and the pre-amplification circuit (32) are successively arranged in a stack-up manner; and a metal sensing board (342) provided at an outer side of a box wall of the insulating seal box (34) closing to the metal cover plate of the MEMS electric field sensitive chip (31).

19. The MEMS-based atmospheric electric field sensor on the ground of claim 18, wherein the metal sensing board (342) is electrically connected to the electric conducting connecting column (12) through a conducting wire.

20. The MEMS-based atmospheric electric field sensor on the ground of claim 18, wherein the insulating seal box is configured to accommodate the MEMS electric field sensitive chip (31), the pre-amplification circuit (32), and the driving demodulation circuit (33), wherein the MEMS electric field sensitive chip (31), the pre-amplification circuit (32), and the driving demodulation circuit (33) are successively arranged in the stack-up manner.

* * * * *